United States Patent
Chen et al.

(10) Patent No.: US 11,196,335 B2
(45) Date of Patent: Dec. 7, 2021

(54) ULTRA-LOW-POWER MODE CONTROL CIRCUIT FOR POWER CONVERTER

(71) Applicant: SOUTHEAST UNIVERSITY, Nanjing (CN)

(72) Inventors: Chao Chen, Nanjing (CN); Jun Yang, Nanjing (CN); Xinning Liu, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 16 days.

(21) Appl. No.: 16/968,594

(22) PCT Filed: Apr. 30, 2020

(86) PCT No.: PCT/CN2020/087986
§ 371 (c)(1),
(2) Date: Aug. 9, 2020

(87) PCT Pub. No.: WO2020/233385
PCT Pub. Date: Nov. 26, 2020

(65) Prior Publication Data
US 2021/0344266 A1 Nov. 4, 2021

(30) Foreign Application Priority Data
May 23, 2019 (CN) .......................... 201910435501.5

(51) Int. Cl.
*H02M 1/00* (2006.01)
*H02M 3/07* (2006.01)
*H03K 3/037* (2006.01)

(52) U.S. Cl.
CPC ........... *H02M 1/0032* (2021.05); *H02M 3/07* (2013.01); *H03K 3/037* (2013.01)

(58) Field of Classification Search
CPC ....... H02M 1/0032; H02M 3/07; H03K 3/037
USPC ......................................................... 327/333
See application file for complete search history.

(56) References Cited

U.S. PATENT DOCUMENTS

| 8,786,350 B1 * | 7/2014 | Pelley ..................... H03K 3/021 327/333 |
| 2016/0173096 A1 * | 6/2016 | Inoue ............... H03K 3/356104 327/333 |
| 2016/0254815 A1 * | 9/2016 | Oak ............... H03K 19/018528 327/333 |

FOREIGN PATENT DOCUMENTS

| CN | 101640531 A | 2/2010 |
| CN | 102158180 A | 8/2011 |
| CN | 104639167 A | 5/2015 |
| CN | 110098732 A | 8/2019 |
| KR | 101661881 B1 | 9/2016 |

\* cited by examiner

*Primary Examiner* — Tomi Skibinski
(74) *Attorney, Agent, or Firm* — Bayramoglu Law Offices LLC

(57) ABSTRACT

An ultra-low-power mode control circuit for a power converter includes four modules: a level shift circuit, a start circuit, a static clamp circuit, and a control circuit. When a chip is powered on and a core voltage has not been established, the control circuit firstly starts a power source built-in clock to support operation of the power converter. When the core voltage is established, the control circuit determines whether to switch to an external clock according to a level of a mode selection signal. After the core voltage is powered down, the control circuit automatically wakes up the built-in clock to work.

2 Claims, 2 Drawing Sheets

ULTRA-LOW-POWER MODE CONTROL CIRCUIT FOR POWER CONVERTER

CROSS REFERENCE TO THE RELATED APPLICATIONS

This application is the national phase entry of International Application No. PCT/CN2020/087986, filed on Apr. 30, 2020, which is based upon and claims priority to Chinese Patent Application No. 201910435501.5, filed on May 23, 2019, the entire contents of which are incorporated herein by reference.

TECHNICAL FIELD

The present invention belongs to the technical field of analog circuits and relates to a control circuit. More particularly, the present invention relates to an ultra-low-power mode control circuit for a power converter.

BACKGROUND

In order to obtain high energy conversion efficiency, the switched-capacitor power converter has become a critical structure to realize the conversion of an Input/Output (IO) voltage into a core voltage. Unlike traditional static linear regulators, the above power source needs a continuous clock signal to maintain operation, and converts an IO voltage of approximately 3V into a core voltage of around 1V. A clock generation circuit typically uses the core voltage to supply power to achieve optimal energy efficiency. At the moment when the power converter starts, the output core voltage has not been established, and the clock circuit cannot start at this time, which causes the power converter to lock up. To overcome this problem, a built-in clock generation circuit is generally provided in the power converter for starting. After the core voltage is established, it is possible to select whether to continue using the built-in clock or to use a low-frequency normally-open oscillator clock. Moreover, the mode control signal is floating at the beginning of the power-on mode, and the control circuit needs to activate the built-in clock source automatically. After the core voltage is turned off, the circuit needs to switch from an external clock mode to a built-in clock mode automatically.

SUMMARY

In view of the above-mentioned problems in the prior art, the present invention provides an ultra-low-power mode control circuit for a power converter. This technical solution is used for clock mode control of the switched-capacitor power converter. The switched-capacitor power converter has the following requirements for the control circuit: at the beginning of the power-on mode, a built-in clock of the power source needs to be started to support the operation of the power converter; when the core voltage is established, the control circuit determines whether to switch to an external clock according to the level of a mode selection signal; and after the core voltage is powered down, the control circuit automatically wakes up the built-in clock to work.

In order to realize the above-mentioned objective, the present invention adopts the following technical solution. An ultra-low-power mode control circuit for a power converter includes a first P-channel metal oxide semiconductor (PMOS) transistor PM1, a second P-channel metal oxide semiconductor transistor PM2, a third P-channel semiconductor transistor PM3, a fourth P-channel metal oxide semiconductor transistor PM4, a first N-channel metal oxide semiconductor (NMOS) transistor NM1, a second N-channel metal oxide semiconductor transistor NM2, a third N-channel metal oxide semiconductor transistor NM3, a fourth N-channel metal oxide semiconductor transistor NM4, a fifth N-channel metal oxide semiconductor transistor NM5, a sixth N-channel metal oxide semiconductor transistor NM6, a first capacitor C1, a second capacitor C2, a first inverter I1 and a second inverter I2. The source of the first P-channel metal oxide semiconductor transistor (hereinafter referred to as PMOS transistor) PM1 is connected to a high-voltage power source, the gate of PM1 is connected to the drain of the second PMOS transistor PM2, and the drain of PM1 is connected to the drain of the first N-channel metal oxide semiconductor transistor (hereinafter referred to as NMOS transistor) NM1. The gate of NM1 is connected to a mode selection switch, and the source of NM1 is grounded. The source of PM2 is connected to the high-voltage power source, and the gate of PM2 is connected to the drain of PM1. The drain of the second NMOS transistor NM2 is connected to the drain of PM2, the gate of NM2 is connected to the drain of the fourth NMOS transistor NM4, and the source of NM2 is grounded. The gate of NM4 is connected to the mode selection switch, and the source of NM4 is grounded. The gate of the third NMOS transistor NM3 is grounded, the drain of NM3 is connected to the mode selection switch, and the source of NM3 is grounded. The positive terminal of the first capacitor C1 is connected to the mode selection switch, and the negative terminal of C1 is grounded. The positive terminal of the second capacitor C2 is connected to the high-voltage power source, and the negative terminal of C2 is connected to the drain of NM4. The source of the third PMOS transistor PM3 is connected to the high-voltage power source, the gate of PM3 is connected to the high-voltage power source, and the drain of PM3 is connected to the drain of NM4. The drain of the fifth NMOS transistor NM5 is connected to the drain of NM2, the gate of NM5 is connected to the drain of the sixth NMOS transistor NM6, and the source of NM5 is grounded. The gate of NM6 is connected to the mode selection switch, and the source of NM6 is grounded. The drain of the fourth PMOS transistor PM4 is connected to the drain of NM6, the gate of PM4 is connected to the mode selection switch, and the source of PM4 is connected to a core voltage. The input of the first inverter I1 is connected to the drain of PM2, and the output of the first inverter I1 is connected to an external clock enable signal. The input of the second inverter I2 is connected to the drain of PM1, and the output of the second inverter I2 is connected to a built-in clock enable signal. When the high-voltage power source is input and powered on, the circuit latches an initial value of a control voltage to a state of a built-in clock source by the capacitor C2 to activate the built-in clock source and establish the core voltage. After the core voltage is established, the mode selection control signal is effective. In order to avoid the uncertainty caused by the floating control signal in this stage, a high-value resistor composed of an NMOS transistor in a cut-off region is configured to pull the control signal to the ground, and a high-value resistor composed of a PMOS transistor in the cut-off region is configured to lock the state of control mode in the built-in clock mode. When the core voltage is powered down, the circuit locks an internal latch in the built-in clock mode by the PMOS high-value resistor to reestablish the core voltage. When a chip is powered on and the power converter has not established the core voltage, the control circuit firstly starts the built-in clock of the power source to support the operation of the power converter. When the core voltage is established, the control circuit determines whether to switch to the external clock according to a level of the mode selection signal. After the core voltage is powered down, the control circuit automatically wakes up the built-in clock to work. This circuit has characteristics such as low power consumption and reliable operation.

As an improvement of the present invention, when the chip is powered on and the core voltage has not been established, the control circuit firstly starts the power source built-in clock to support the operation of the power converter. When the core voltage is established, the control circuit determines whether to switch to the external clock according to the level of the mode selection signal. After the core voltage is powered down, the control circuit automatically wakes up the built-in clock to work.

Compared with the prior art, the present invention has the following advantages. The mode control circuit of the switched-capacitor power converter proposed by the present invention starts the built-in clock in the power-on stage of the chip to support the operation of the power converter. When the core voltage is established, the control circuit determines whether to switch to the external clock according to the level of the mode selection signal. After the core voltage is powered down, the control circuit can automatically wake up the built-in clock to work. This circuit has characteristics such as low power consumption and reliable operation. Moreover, when the input clock is powered down due to external interference, this circuit functions to automatically activate the on-chip clock and restore the power supply.

DETAILED DESCRIPTION OF THE EMBODIMENTS

In order to facilitate the understanding of the present invention, the present embodiment will be described in detail with reference to the drawings.

Figure 1:
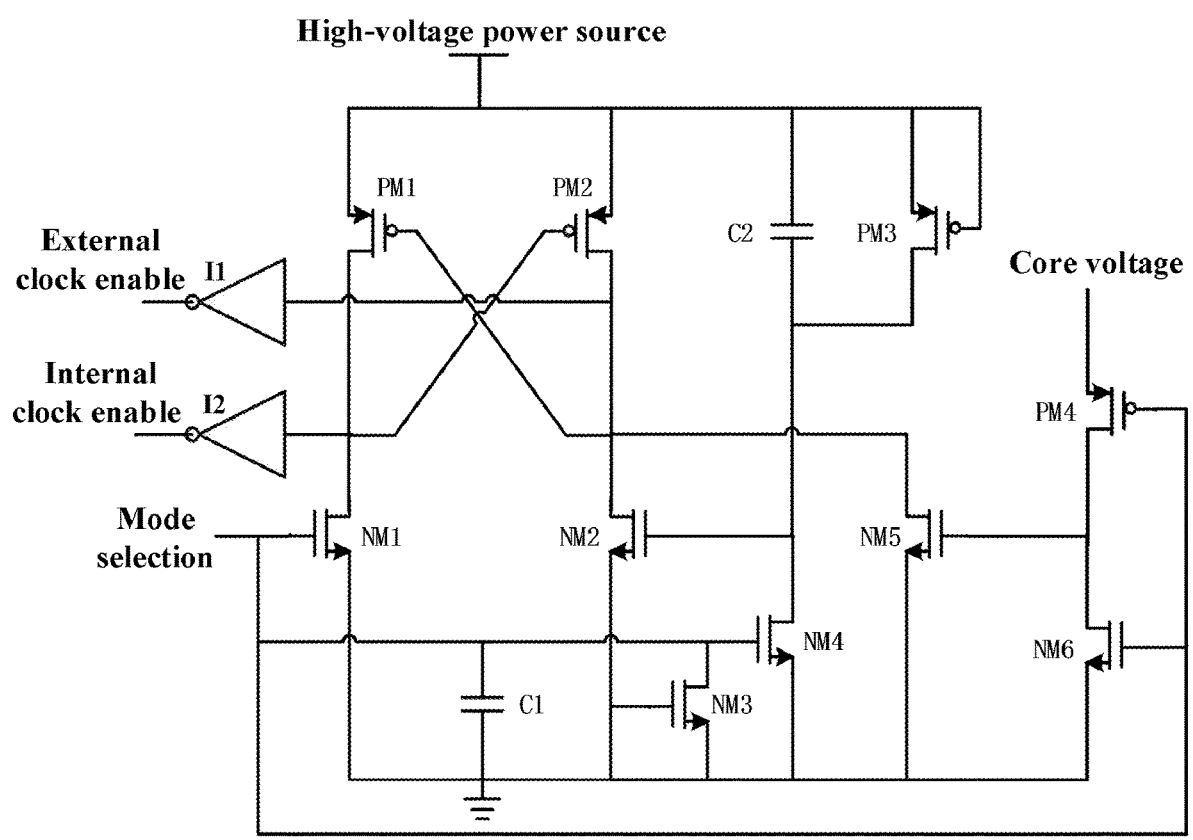
FIG. 1 is a structural diagram of the mode control circuit for the power converter of the present invention.
Figure 2:
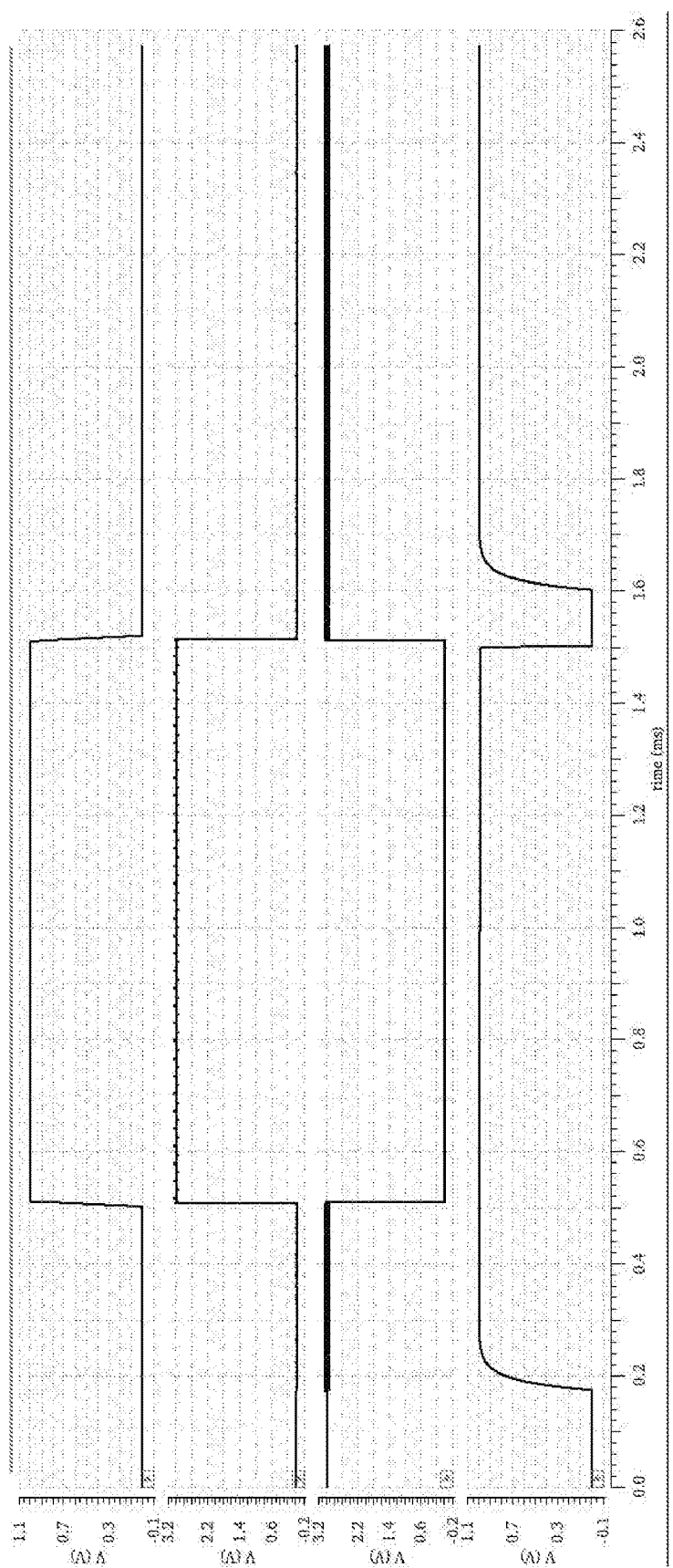
FIG. 2 schematically shows a mode control input, an external clock enable control output, an internal clock enable control output and a core voltage (from top to bottom) of the power converter of the present invention in a start state and a mode switching state.

Embodiment 1: Referring to FIGS. 1 and 2, an ultra-low-power mode control circuit for a power converter includes the first P-channel metal oxide semiconductor transistor PM1, the second P-channel metal oxide semiconductor transistor PM2, the third P-channel metal oxide semiconductor transistor PM3, the fourth P-channel metal oxide semiconductor transistor PM4, the first N-channel metal oxide semiconductor transistor NM1, the second N-channel metal oxide semiconductor transistor NM2, the third N-channel metal oxide semiconductor transistor NM3, the fourth N-channel metal oxide semiconductor transistor NM4, the fifth N-channel metal oxide semiconductor transistor NM5, the sixth N-channel metal oxide semiconductor transistor NM6, the first capacitor C1, the second capacitor C2, the first inverter I1 and the second inverter I2. The source of the first P-channel metal oxide semiconductor transistor (hereinafter referred to as PMOS transistor) PM1 is connected to a high-voltage power source, the gate of the PM1 is connected to the drain of the second PMOS transistor PM2, and the drain of the PM1 is connected to the drain of the first N-channel metal oxide semiconductor transistor (hereinafter referred to as NMOS transistor) NM1. The gate of the NM1 is connected to a mode selection switch, and the source of the NM1 is grounded. The source of the PM2 is connected to the high-voltage power source, and the gate of the PM2 is connected to the drain of the PM1. The drain of the second NMOS transistor NM2 is connected to the drain of the PM2, the gate of the NM2 is connected to the drain of the fourth NMOS transistor NM4, and the source of the NM2 is grounded. The gate of the NM4 is connected to the mode selection switch, and the source of the NM4 is grounded. The gate of the third NMOS transistor NM3 is grounded, the drain of the NM3 is connected to the mode selection switch, and the source of the NM3 is grounded. The positive terminal of the first capacitor C1 is connected to the mode selection switch, and the negative terminal of the C1 is grounded. The positive terminal of the second capacitor C2 is connected to the high-voltage power source, and the negative terminal of the C2 is connected to the drain of the NM4. The source of the third PMOS transistor PM3 is connected to the high-voltage power source, the gate of the PM3 is connected to the high-voltage power source, and the drain of the PM3 is connected to the drain of the NM4. The drain of the fifth NMOS transistor NM5 is connected to the drain of the NM2, the gate of the NM5 is connected to the drain of the sixth NMOS transistor NM6, and the source of the NM5 is grounded. The gate of the NM6 is connected to the mode selection switch, and the source of the NM6 is grounded. The drain of the fourth PMOS transistor PM4 is connected to the drain of the NM6, the gate of the PM4 is connected to the mode selection switch, and the source of the PM4 is connected to a core voltage. An input of the first inverter I1 is connected to the drain of the PM2, and an output of the first inverter I1 is connected to an external clock enable signal. An input of the second inverter I2 is connected to the drain of the PM1, and an output of the second inverter I2 is connected to a built-in clock enable signal.

FIG. 2 schematically shows a mode control input, an external clock enable control output, an internal clock enable control output and a core voltage (from top to bottom) of the power converter of the present invention in a start state and a mode switching state, which illustrates that in the initial stage of power-on, the core voltage has not been established. At this time, the controller turns on the built-in clock enable to quickly establish the core voltage. When the input control signal is switched to the external clock mode, the controller quickly switches to the external clock mode. When the power source voltage is powered down due to a sudden situation, and the external clock and the input control signal are powered down concurrently, the mode control output signal automatically switches to the built-in clock mode, restarts the built-in oscillator within 0.1 millisecond and drives the power converter to reestablish the core voltage.

The working principle of the present invention is as follows. Referring to FIGS. 1 and 2, when a high-voltage power source is input and powered on, the circuit latches an initial value of the control voltage to the state of a built-in clock source by the capacitor C2 to activate the built-in clock source and establish the core voltage. After the core voltage is established, the mode selection control signal is effective. In order to avoid the uncertainty caused by the floating control signal in this stage, a high-value resistor composed of the transistor NM3 in the cut-off region is configured to pull the control signal to the ground, and a high-value resistor composed of the PMOS transistor PM3 in the cut-off region is configured to lock the state of control mode in the built-in clock mode. When the core voltage is powered down, the circuit locks the internal latch in the built-in clock mode by the PM3 high-value resistor to reestablish the core voltage.

It should be noted that the foregoing embodiments are not intended to limit the scope of protection of the present invention, and equivalent transformations or substitutions made based on the above technical solutions shall fall within the scope of protection of the claims of the present invention.

What is claimed is:

1. An ultra-low-power mode control circuit for a power converter, comprising:
    a first P-channel metal oxide semiconductor (PMOS) transistor, a second PMOS transistor, a third PMOS transistor, a fourth PMOS transistor, a first N-channel metal oxide semiconductor (NMOS) transistor, a second NMOS transistor, a third NMOS transistor, a fourth NMOS transistor, a fifth NMOS transistor, a sixth NMOS transistor, a first capacitor, a second capacitor, a first inverter and a second inverter;
    wherein
    a source of the first PMOS transistor is connected to a high-voltage power source, a gate of the first PMOS transistor is connected to a drain of the second PMOS transistor, and a drain of the first PMOS transistor is connected to a drain of the first NMOS transistor;
    a gate of the first NMOS transistor is connected to a mode selection switch, and a source of the first NMOS transistor is grounded;
    a source of the second PMOS transistor is connected to the high-voltage power source, and a gate of the second PMOS transistor is connected to the drain of the first PMOS transistor;
    a drain of the second NMOS transistor is connected to the drain of the second PMOS transistor, a gate of the second NMOS transistor is connected to a drain of the fourth NMOS transistor, and a source of the second NMOS transistor is grounded;
    a gate of the fourth NMOS transistor is connected to the mode selection switch, and a source of the fourth NMOS transistor is grounded;
    a gate of the third NMOS transistor is grounded, a drain of the third NMOS transistor is connected to the mode selection switch, and a source of the third NMOS transistor is grounded;
    a positive terminal of the first capacitor is connected to the mode selection switch, and a negative terminal of the first capacitor is grounded;
    a positive terminal of the second capacitor is connected to the high-voltage power source, and a negative terminal of the second capacitor is connected to the drain of the fourth NMOS transistor;
    a source of the third PMOS transistor is connected to the high-voltage power source, a gate of the third PMOS transistor is connected to the high-voltage power source, and a drain of the third PMOS transistor is connected to the drain of the fourth NMOS transistor;
    a drain of the fifth NMOS transistor is connected to the drain of the second NMOS transistor, a gate of the fifth NMOS transistor is connected to a drain of the sixth NMOS transistor, and a source of the fifth NMOS transistor is grounded;
    a gate of the sixth NMOS transistor is connected to the mode selection switch, and a source of the sixth NMOS transistor is grounded;
    a drain of the fourth PMOS transistor is connected to the drain of the sixth NMOS transistor, a gate of the fourth PMOS transistor is connected to the mode selection switch, and a source of the fourth PMOS transistor is connected to a core voltage;
    an input of the first inverter is connected to the drain of the second PMOS transistor, and an output of the first inverter is connected to an external clock enable signal; and
    an input of the second inverter is connected to the drain of the first PMOS transistor, and an output of the second inverter is connected to a built-in clock enable signal.

2. The ultra-low-power mode control circuit for the power converter according to claim 1, wherein, when a chip is powered on and a core voltage has not been established, the ultra-low-power mode control circuit starts a built-in clock of a power source to support operation of the power converter;
    when the core voltage is established, the ultra-low-power mode control circuit determines whether to switch to an external clock according to a level of a mode selection signal; and
    after the core voltage is powered down, the ultra-low-power mode control circuit automatically wakes up the built-in clock to work.

* * * * *